United States Patent [19]

Van Reymersdal

[11] 4,293,930

[45] Oct. 6, 1981

[54] BUBBLE DETECTION SYSTEM

[75] Inventor: Joseph Van Reymersdal, Fairless Hills, Pa.

[73] Assignee: Sperry Corporation, New York, N.Y.

[21] Appl. No.: 87,911

[22] Filed: Oct. 24, 1979

[51] Int. Cl.$^3$ .......................... G11C 7/02; G11C 19/08
[52] U.S. Cl. .......................................... 365/8; 365/193
[58] Field of Search ...................... 365/7, 8, 9, 10, 158, 365/193

[56] References Cited

U.S. PATENT DOCUMENTS 3,953,840  4/1976  Cutler et al. ............................. 365/7

Primary Examiner—James W. Moffitt

Attorney, Agent, or Firm—Rene A. Kuypers

[57] ABSTRACT

There is disclosed a double detection arrangement for minimizing soft errors emanating from a bubble memory. Soft errors are errors due to sporadic, periodic, and random noise which gives an erroneous indication of a bubble's presence. The arrangement provides double detection by sampling a bubble signal's wave shape on its positive and negative transition within a certain time frame. When a positive and negative transition are detected within a specified time frame, the presence of a bubble is considered to be present. Conversely, when only a single positive or only a single negative transition is detected within the time frame, the absence of a bubble or noise is assumed.

6 Claims, 2 Drawing Figures

BUBBLE DETECTION SYSTEM

BACKGROUND OF THE INVENTION

1. Field of the Invention

The invention relates to bubble memories and in particular to the detection thereof.

2. Description of the Prior Art

A recognized shortcoming of present-day bubble memory devices has been that their error rate (i.e., errors per number of bits read during a cycle) is not equivalent to that of other known digital memory devices such as magnetic tape, drums and disks. The error rate criteria for tape, drums and disks is established at the present time as one error per $10^9$ bits of read data. As of this time, the error rate of bubble memories is several orders of magnitude under the above rate. Hence, it is clear that if the bubble memory is to become viable in today's commercial marketplace, it must improve its error rate.

The errors that may be generated by a bubble memory are designated as either soft or hard errors. Soft errors are defined as errors which arise because random or sporadic noise may be interpreted as a signal (i.e., presence of a bubble), whereas hard errors are errors produced by an unaccounted for disappearance of a bubble signal or bubble, either in the bubble's electronics or in its integrated circuitry. The present invention has as its purpose to minimize the soft errors.

Known prior art bubble detection techniques have encountered a relatively high soft error rate since the bubble signal is difficult to distinguish with respect to high background noise. The background noise is due primarily to a rotating magnetic field which is generated by a mechanism for propagating bubbles around its circuit loop. Now the prior art makes only one attempt to determine whether a bubble signal is present or not present in a certain time frame and it has been determined that the above-mentioned background noise sometimes is interpreted as a bubble signal whereas in reality there is no such signal present.

Accordingly, it is an object of the present invention to obviate the above-mentioned shortcomings of the prior art.

SUMMARY OF THE INVENTION

The present invention minimizes soft errors in the detection of bubble signals in a bubble memory system by detecting the signal during its rise time and again during the signal's fall time. In effect, the present invention doubly determines whether a bubble signal is present within a certain time span in the above-mentioned strong, noisy environment.

The bubble output signal is processed by sampling the signal during its rise and fall time. If both signals are present, an indication is registered by a counter which is designed to count to two within a certain time period after which it will be re-set to zero. If the register only counts to one within the designated time period, it will be obvious that the signal detected was a noise signal. In other words, a signal will be characterized as a bubble signal only if the register counts two signals within a certain time frame and at designated sampling times.

It should be noted, however, that a possibility of two noise signals or spikes occurring during the sampling time is extremely remote because noise signals occur in a random fashion. Therefore, it is highly unlikely that the 2-bit register will indicate a count of two within a specified time period when there is an absence of a bubble signal.

BRIEF DESCRIPTION OF THE PREFERRED EMBODIMENT

Figure 1:
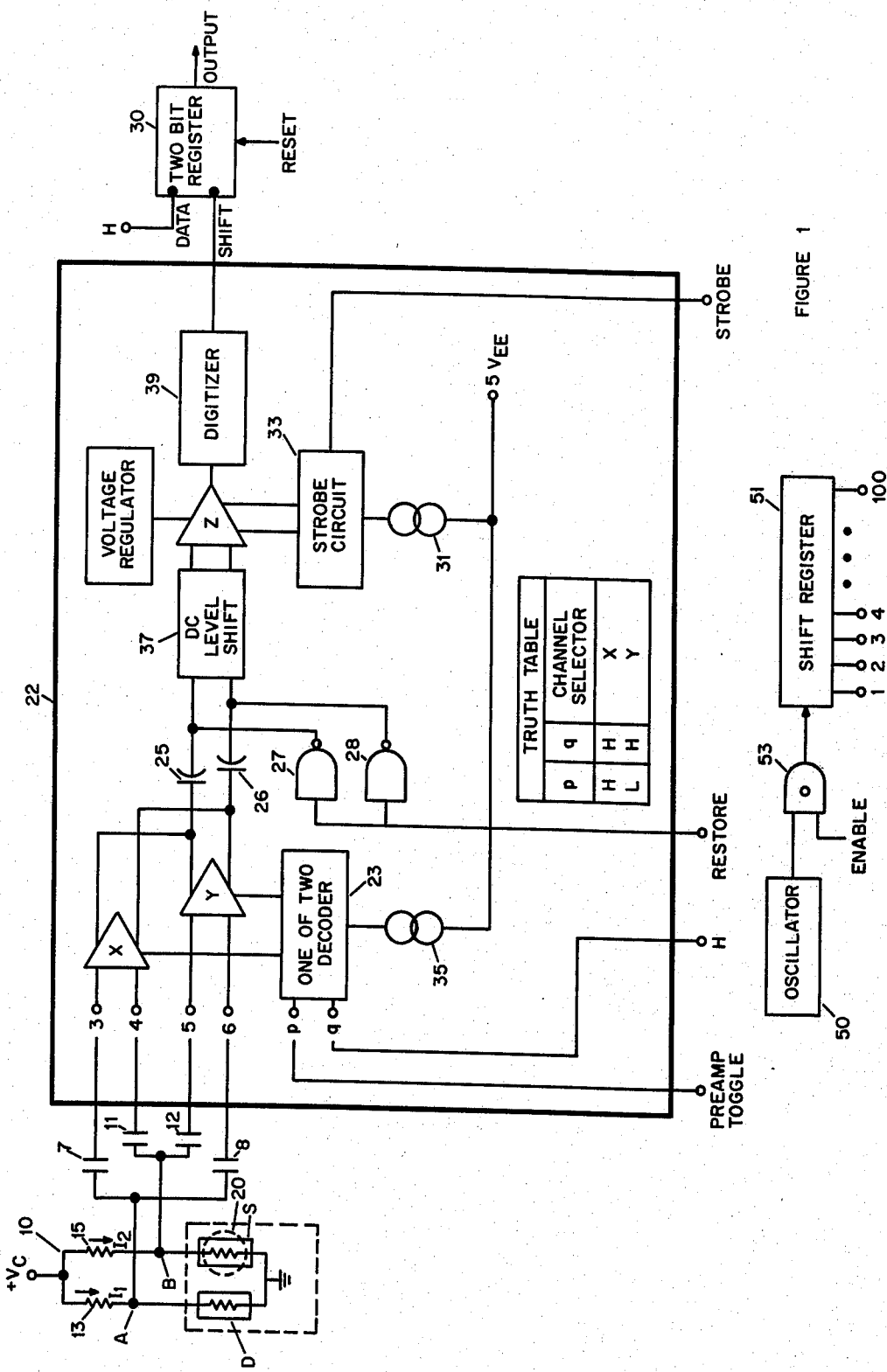
FIG. 1 is a block diagram of the double detection scheme employed in this invention.

Referring now to FIG. 1 in greater detail, there is depicted a bridge circuit 10 for detecting a bubble's presence in a bubble propagation circuit (not shown). As is well known in the bubble memory art, a bubble propagation circuit consists essentially of a circular bubble loop called a major loop which may be conventionally comprised of a plurality of Permalloy T-bar bubblemovers. A rotating magnetic field, which will be discussed in detail hereinafter, is an essential component of bubble memories used to successively magnetize the T-bar bubble-movers so that bubbles may be propagated around the major loop. The rotating magnetic field rotates in the plane of the drawing. Minor loops (not shown) associated with the major loop are positioned around the latter's periphery so that bubbles may be transferred from the major to the minor loop and vice versa. The rotating magnetic field simultaneously causes the magnetic bubbles to propagate around the minor loops.

The bubble bridge circuit 10 is utilized for detecting or sensing bubbles along the bubble major loop. The bridge sensing circuit 10 is comprised of four resistive components 13, 15, D and S, which are connected between the voltage +Vc and ground. Elements D, S are thin, magnetoresistive Permalloy sensor strips which are positioned over a chevron shaped stretcher (not shown) of the major loop at which sensing is to be done. Chevron stretchers are used in the sensor area to stretch the dimensions of the bubble in order to obtain a greater output signal. Sensors D and S are elements whose resistance changes in the presence of a magnetic field. The bridge sensor 10 is placed at the last element, or exit element, of the major loop. The last or exit element of a bubble major loop is similar to a last stage of a serial shift register. Resistive elements 13, 15 are conventional discrete members. The four resistive components each have a value of one thousand ohms in a quiescent or unenergized state.

A D.C. current is produced through bridge 10 from +Vc to ground via respective legs comprising discrete resistors 13, D and 12, S. Current I flows to ground through resistors 13, D and current $I_2$ flows to ground through resistors 15, S. Since these currents are equal in magnitude and opposite one another, they cancel each other. Therefore, in a quiescent state or when no bubble is being detected, the voltage across nodes A, B is zero.

The operation of the bridge circuit 10 will be briefly discussed below when detecting a bubble memory element 20. When a bubble 20, which is assumed to be propagating along a major loop (not shown), is about to be sensed or detected by the sensor S by passing thereunder, the bubble's magnetic field will cause the sensor's resistance to lower by a certain amount because it is magnetorestrictive in nature. This action will cause the voltage at node A to go positive with respect to node B by a certain value for the reason discussed hereinafter. The decrease of resistance of sensor S causes the current $I_2$ to increase in magnitude over that of current $I_1$. Therefore, the voltage drop across resistor 15 will be greater than the voltage drop across resistor 13 and node B's voltage will decrease with respect to node A's voltage.

As the rotating magnetic field continues to operate, the magnetic bubble 20 moves away from the magnetoresistive sensor S in the direction of the magnetoresistive sensor D thereby producing another resistance change in the sensor S. In other words, when bubble 20 is removed from under sensor S, its resistance value returns to an original value and, therefore, the voltage of node B goes positive with respect to the voltage of node A or node A goes negative with respect to node B. Accordingly, a positive followed by a negative signal or voltage doublet is provided.

Accordingly, the two resistance changes in the magnetoresistive element S causes a bubble signal to be produced across nodes A, B having two components (i.e., a leading and trailing edge) which will be utilized in the operation of this invention. Thus, when the bubble 20 is propagated under the sensor S, the voltage node A goes positive with respect to node B to generate a positive leading edge on the bubble signal as previously discussed; and when the bubble 20 is propagated away from the sensor S, the voltage at node B goes positive with respect to node A and the voltages at nodes A, B are again at the same potential and a negative trailing edge of the bubble signal is generated thereby.

A respective output of the bridge circuit 10 from nodes A, B is directed into a sensing amplifier 22. Sense amplifier 22 is an MC 1544L integrated circuit chip made by Motorola. A short description below will discuss in general the chip's operation, however, further details of this integrated circuit may be found in "Linear Integrated Circuits Data Book", Third Edition by Motorola Semiconductor Products, Inc.

Input signals from nodes A, B of the bridge 10 are directed into differential amplifiers or channels X, Y via coupling capacitors 7, 8, 11 and 12. Each of the differential amplifiers X, Y has two input terminals 3, 4 and 5, 6 respectively. The operation of amplifiers X, Y is such that input 3 must be positive with respect to input 4 and, input 5 must be positive with respect to input 6. Therefore, either differential amplifiers X or Y will be selected depending upon whether nodes A or B are made positive when a bubble 20 enters or leaves the sensor S of bridge 10.

Selection of differential amplifier channel X or Y is achieved by a decoder 23 which is adapted to receive input signals p, q in accordance with information set forth in a Truth Table. In accordance with the Truth Table, the input voltage at terminal q is always a high (H) or a positive voltage. When input p is also a H voltage, channel X is selected, whereas when it is a Low (L) voltage or ground, the decoder 23 will select channel Y.

After being differentially amplified by channels X, or Y the signal is capacitively coupled by means of either capacitors 25, 26 to a second differential amplifier Z via a DC Level Shift. A D.C. restore or clamping operation is performed on the signal before it is amplified by differential amplifier Z. The DC Restore operation is achieved by means of D.C. restore circuits 27, 28 which operate in conjunction with the restore input signal. In operation, when the restore signal is 3 volts positive or H, the capacitors 25, 26 are at ground potential so that no signal can get through to amplifier Z. On the other hand, when the restore signal itself is at ground (i.e., 0 volts) potential, the capacitors 25, 26 will couple the bubble detection signal to amplifier Z. Accordingly, the restoring function performed by the circuits 27, 28 is designed to transfer the bubble signal via capacitors 25, 26 to the DC Level Shift circuit 37 and thence to the two inputs of amplifer Z with respect to ground potential. In other words, ground potential is restored to the bubble signal being transferred because a DC component of the signal has been lost due to extensive capacitive coupling existing throughout the sense amplifier 22 (i.e., due to capacitors 7, 8, 11, 12, 25, 26). If a DC restore or clamp operation were not performed, the signals applied to the DC Level Shift and differential amplifier Z would be at a floating potential, which would be difficult for the circuitry to handle.

After the signals are DC restored or clamped to ground after passing through the capacitors 25, 26, the signals are transferred to the differential amplifier Z via the DC Level Shift. A strobe signal activates the amplifier Z which in effect samples the amplified bubble signal within a specified time period. As will be discussed in greater detail hereinafter, the bubble signal will be sampled during its rise and fall time. It should be noted that constant current sources 31, 35 are required for operation at differential amplifiers X, Y and Z, which are applied through the strobe circuit 33 as well as the decoder 23.

Figure 2:
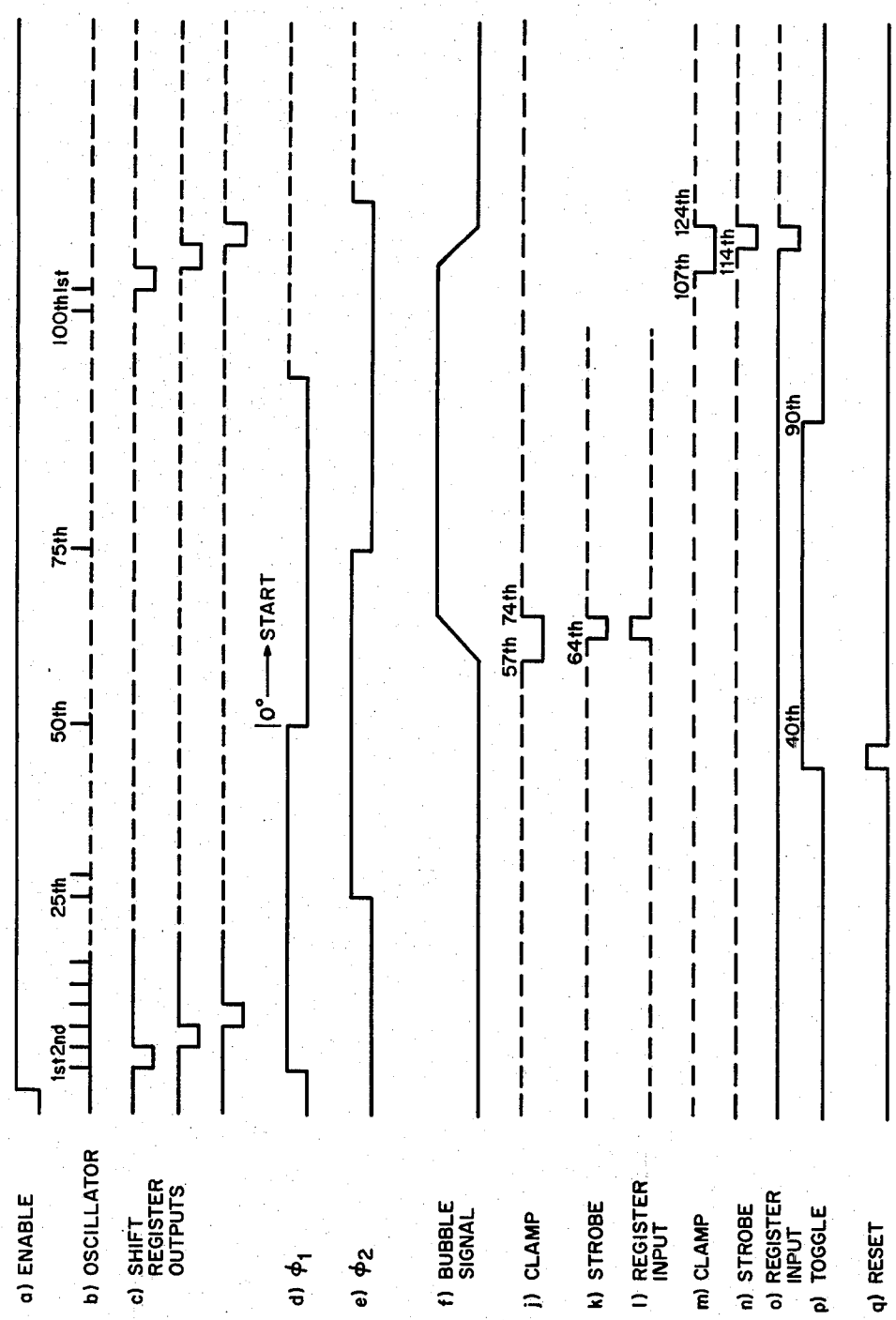
FIG. 2 represents the signals developed by the various circuit blocks of FIG. 1.

The dual input applied to the input of amplifier Z is formed into a single ended output which is applied to a digitizer 39. The digitizer 39 converts the amplifier Z output from an analog to a digital signal. The digital or pulse output from sense amplifier 22 is directed into a two stage (i.e., a two bit) shift register 30. In particular, the output of sense amplifier 22 is directed into an input of register 30 for shifting 30. The register 30 has a reset capability which enables it to be readily reset to zero within a certain time frame by means which will be discussed in a later paragraph. In other words, the register 30 has a specified time period to fill its two stages and produce a signal at its output terminal which is indicative of that fact. The use of the above mentioned apparatus will become clearer when discussed in association with the timing signals of FIG. 2.

As is well appreciated in the bubble memory art, the various timing signals including generation of a magnetic rotating field is produced, for example, from a crystal controlled oscillator 50. In the invention at hand, a 10 megahertz oscillator 50 is utilized in conjunction with a one hundred stage shift register 51. The output of the oscillator 51 (see FIG. 2b) is directed into a one-hundred stage shift register 51 via an AND gate 53. The shift register 51 becomes active because the AND gate 53 is permissed with an ENABLE signal (FIG. 2a), together with the output of oscillator 50. The ENABLE signal originates from a memory controller (not shown) which receives a command from a computer's central processor to fetch a block of data from the bubble memory. The period or the time between pulses from adjacent output terminals of the shift register 51 is 0.1 microseconds and it will take 10 microseconds to produce an output between terminals 1 and 100. Outputs from output terminals 1, 2 and 3 of the shift register 51 are shown by way of example in FIG. 2c. By utilizing the signals generated by the shift register 51 with well known set-reset flip-flops, signals of various duration and timing may be generated for operations of the present invention as will be discussed below.

For example, the rotating magnetic field required for propagating a bubble memory is produced by respectively applying two sine waveforms which are ninety degrees out of phase with one another to respective orthogonally positioned coils (not shown). This operation is discussed in some detail, for example, in U.S. Pat. No. 37,564 filed on May 9, 1979. By tapping the output of the 1st and 50th terminals of the shift register 51 and applying these signals to respective Set and Reset terminals of a flip-flop (not shown), as well as tapping the output of the 25th and 75th terminals and applying these signals to respective Set and Reset terminals of another flip-flop (not shown) two 90° out of phase square waves ($\phi$1, $\phi$2) will be generated (see FIG. 2d, e). These respective phase $\phi$1, $\phi$2 waveforms having a 50% duty cycle are applied to well-known driver circuits discussed in the U.S. Patent specification above mentioned for transforming square waves to sine waves. Waveforms $\phi$1, $\phi$2 are then respectively applied to orthogonally positioned coils (i.e., L, L' in patent specification above), thereby producing a circular or shaped magnetic field for propagating bubbles around major and minor loops. It should be understood that all flip-flops discussed in this invention for timing purposes are cleared prior to the generation of the above ENABLE signal.

Referring again to FIG. 2d, a zero degree or start designation is indicated. This start position is arbitrarily selected herein and is designated as such by various bubble memory vendors such as Texas Instrument and may be observed in a Texas Instrument brochure entitled "Magnetic Bubble Memories and System Interface Circuits," Circular 63133 CSS177. The start designation indicates when the various circuitry will begin to detect or sense bubble signals and in our particular case the zero degree position will correspond to the 50th pulse emanating from the 50th terminals of Shift Register 51.

Let us now assume that the rotating magnetic field causes the bubble memory elements to propagate around the major loop (not shown) so that a bubble 20 is eventually propagated under the magnetorestrictive sensor S (FIG. 1). As previously discussed, as the bubble 20 passes under the sensor S, its resistance decreases so that node A goes positive with respect to note B. The bubble signal that is detected by sensor S is shown in FIG. 2(f) where it is seen that the signal's leading edge is positive going and is designated as beginning on the 57th pulse assuming a 100 kilohertz cycle time, (i.e., the pulse from the 57th terminal of shift register 51). The 57th pulse is selected since it is a convenient time beginning from the zero degree start location. It will be recalled that each pulse (FIG. 2b) takes 0.1 microseconds. Therefore the start of the bubble signal occurs 0.7 microseconds after the start position.

It will be recalled that differential amplifiers X or Y must be selected for the signal from the bridge 10 to be properly sensed by the sense amplifier 20 and this is accomplished by activating the inputs p, q of the decoder with proper voltages as shown in the truth table. Therefore, since node A is positive with respect to node B, differential amplifier X is to be activated. As seen from the truth table, to select amplifier X, inputs p, q must both be a H voltage. Accordingly, the preamplifier toggle (see FIG. 2p) is made a H voltage just prior in time at the 40th pulse to when the leading edge of bubble memory signal is being sensed at the 57th pulse.

Since the input q (FIG. 1) is always H or a positive voltage, the decoder 23 will properly select amplifier X and therefore the constant current source 35 will activate the amplifier. The preamp toggle remains H until the 90th pulse period in order to activate the preamplifiers X, Y during the rise time of the bubble signal. It should be noted here that a reset signal is applied to the two-bit register 30 every 100 pulses from shift register 51 so that it is also conditioned to begin receiving signals from the output of sense amplifier 22.

Therefore, the bubble signal (FIG. f) beginning with its leading edge will be coupled via capacitors 7, 11 to the input terminals 3, 4 of differential amplifier X. As is well known, the differential amplifier X, Y are utilized for the rejection of noise that appears on both input terminals 3, 4. This is particularly advantageous when dealing with low level signals such as the bubble memory signal (FIG. 2f) which is on the order of 7.5 millivolts but in a noisy environment caused by the rotating field.

The leading edge of the bubble signal occurs between the 57th to the 74th pulses and a first clamping or restore pulse (FIG. 2j) will be applied during same time period. Once again, this time is selected because the above mentioned vendor has furnished such information. As previously mentioned, the D.C. restore signal enables the signal from amplifier X to be transmitted to the D.C. level shift 37 and amplifier Z with respect to ground.

In order to sample the leading edge of the bubble signal (FIG. 2f), the Strobe signal (FIG. 2k) is applied during the 64th to the 74th pulse period. The time period for this strobing function is also supplied by the mentioned vendor.

The sampled signal (FIG. 2l) is then applied to the two-bit register 30 at its input after passing through a digitizer 39 which converts an analog output from the amplifier into a digital output. The output signal from the digitizer shifts the data in a form of a permanent H input voltage into the first stage of shift register 30.

It has been discovered that the prior art technique of detecting a bubble signal only on its rise time results in a high error rate because the signal to noise ratio is high. In a high noise environment, a noise spike may be readily interpreted as signal and therefore a bubble. In order to substantially improve bubble detection, the present invention further detects the bubble signal (FIG. 2f) on its trailing edge. This is accomplished in the following manner.

It will be recalled in FIG. 1 that when bubble 20 entered under the sensor S of the bridge 10, the voltage at node A went positive with respect to the voltage of node B. When the bubble 20 leaves the area of sensor S and is propagated by the rotating field toward the dummy sensor D, node B will go positive with respect to node A. In other words, nodes A and B will momentarily return to the same voltage.

In order to detect the voltage when node B goes positive with respect to node A, amplifier Y must be activated since amplifier X, Y only operate when respective inputs 3, 5 are positive with respect to inputs 4, 6. Therefore, the signal across nodes A, B is to be tranferred to inputs 5,6 of amplifier Y via the coupling capacitors 8, 12.

Amplifier Y is activated by energizing the decoder 23 input terminals p, q in accordance with the truth table wherein it is shown that input p must be at a L voltage while input q is at a H voltage. Input terminal p automatically becomes L at the 90th pulse which resets the preamp toggle flip-flop (not shown). The flip-flop is reset at the 90th pulse of the oscillator output (FIG. 2a) because this timing is half-way between the bubble signal's pulse width (FIG. f). Since input q is always a H voltage, the conditions are met for selecting amplifier Y. When the conditions of the truth table are met, the signal across nodes A, B is transmitted via capacitors 8, 12 to differential amplifier Y via its input terminal 5, 6.

In order to properly transfer that portion of the bubble memory signal, namely its trailing edge, from preamplifier Y to amplifier Z and the D.C. level shift 37, the restore or clamp signal is applied after coupling capacitor 25, 26 beginning with the 107th pulse (FIG. 2m). It should be understood that the 107th pulse corresponds to the 7th pulse from the register 51. The trailing edge of the bubble signal (FIG. 2f) appears 5 microseconds, that is, 50 pulses (FIG. 2b) after the leading edge was formed. This parameter is determined either by experiment or is given by the bubble vendor. The end of the trailing edge occurs at the 124th pulse (i.e., the 24th pulse) the shift register 51 or 17 pulses after pulse 107 (FIG. 2m). The width of clamp is determined in a similar manner to that described with respect to its leading edge. It will be recalled that the restore or clamping signal is applied after capacitors 25, 26 in order to reference the bubble signal with respect to ground potential. As was previously discussed, because the signal is passed through various capacitors 7, 8, 11, 12 and capacitors 25, 26, the signal tends to float because a D.C. component of the signal is removed. This makes the signal difficult to control.

After passing through the coupling capacitors 25, 26, the trailing edge of the bubble signal is then applied to the D.C. Level Shift 37 and to the input of the differential amplifier Z in the manner previously described.

The bubble signal is strobed or sampled a second time beginning with the 114th pulse (FIG. 2n) from the shift register 51. The strobe signal applied to the amplifier Z causes it to be activated by the constant current source 31 so that an output signal (FIG. 2o) is produced which is a function of the trailing edge of the bubble signal. As previously discussed, this signal is applied to the shift terminal of the register 30 via digitizer 39. As will be recalled, the shifting pulse is adapted to shift the data signal (i.e., a permanent H voltage signal) into one of the two stages of the register 30. Since the detection of the leading edge of the bubble signal caused the register 30 to already store one pulse, the trailing edge thereof will cause the register 30 to become filled by shifting in the H voltage at the data terminal into the first stage. As is understood, the H voltage in the first stage will be shifted to the second stage thereby filling register 30.

An output signal will be produced by the two-bit register 30 when both stages are filled thereby indicating that a true bubble signal has been detected. However, it should be noted here that the output signal produced from the register 30 after counting two pulses corresponding to the leading and trailing edges of a bubble signal must be accomplished within a certain time period. The time period within which the two pulses are to be counted are provided by a signal which is applied to the reset terminal of the two-bit register 30.

This reset signal is made to occur every 40th pulse (FIG. 2q) from shift register 51 or every 10 microseconds. Accordingly, if only one pulse is received by the register 30 within the specified time period, it will be reset by the 40th pulse without any indication being given by the register's output that two pulses have been counted. Therefore, for all practical purposes when such a situation occurs the detection of one such signal indicates presence of a spurious noise signal.

The present invention has produced substantial improvement over known prior art techniques. Thus, empirical data has been taken which shows a soft error improvement of 10,000 where the voltage signal produced by the bubble signal is 5 millivolts and the signal-to-noise ratio is 3.5.

I claim:

1. Apparatus for determining presence or absence of a magnetic bubble comprising:
   (a) means for twice strobing a signal produced by said magnetic bubble;
   (b) means coupled to said sensing means for twice detecting (said) signals produced by said dual strobing within a specified time period,
whereby the detection of said bubble signal twice indicates the presence of a bubble, and the failure to detect a bubble signal twice indicates the absence of a bubble signal.

2. Apparatus in accordance with claim 1 wherein
   a. said means for twice detecting said signal within a specified time period comprises a register with a capacity of two bits.

3. Apparatus in accordance with claim 2 wherein
   a. said means for twice detecting said signal within a specified time period comprises a two-bit shift register.

4. Apparatus in accordance with claim 3 wherein
   a. said means for twice detecting said signal within a specified time period comprises means for detecting said signal during its leading and trailing edges.

5. A method for determining the presence of a magnetic bubble, comprising the steps of:
   (a) strobing for the presence of a bubble memory signal twice within a specified time period, whereby if said magnetic bubble is detected twice by said strobing, the presence of a bubble is assumed; and if
   (b) said bubble signal is detected less than twice within a specified time period, a spurious signal or absence of a bubble is assumed.

6. A method for determining the presence of a bubble memory signal with minimum error comprising the steps of:
   (a) strobing said bubble memory signal twice within a specified time period;
   (b) accepting a double signal produced by said dual strobing as the presence of a magnetic bubble when said signal is detected twice;
   (c) rejecting said signal as being spurious when said signal is detected less than twice, whereby interpreting noise signals as magnetic bubble is minimized.

* * * * *